(12) United States Patent
Kobayashi et al.

(10) Patent No.: US 9,244,137 B2
(45) Date of Patent: Jan. 26, 2016

(54) OPTICAL PUMPING MAGNETOMETER AND MAGNETIC SENSING METHOD

(71) Applicant: CANON KABUSHIKI KAISHA, Tokyo (JP)

(72) Inventors: Tetsuo Kobayashi, Kyoto (JP); Akira Terao, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 87 days.

(21) Appl. No.: 14/258,817

(22) Filed: Apr. 22, 2014

(65) Prior Publication Data
US 2014/0320123 A1    Oct. 30, 2014

(30) Foreign Application Priority Data
Apr. 25, 2013   (JP) ................. 2013-092130

(51) Int. Cl.
G01R 33/032    (2006.01)
G01R 33/26     (2006.01)

(52) U.S. Cl.
CPC .................... *G01R 33/26* (2013.01)

(58) Field of Classification Search
CPC ................................................ G01R 33/032
USPC ............................................. 324/244.1, 304
See application file for complete search history.

(56) References Cited

U.S. PATENT DOCUMENTS

| 8,212,556 B1* | 7/2012 | Schwindt et al. | 324/304 |
| 2005/0206377 A1* | 9/2005 | Romalis et al. | 324/301 |
| 2008/0106261 A1 | 5/2008 | Romalis et al. | |
| 2013/0265042 A1* | 10/2013 | Kawabata et al. | 324/301 |

OTHER PUBLICATIONS

Groeger, S., Pazgalev, A., and Weis, A. "Comparison of discharge lamp and laser pumped cesium magnetometers." Applied Physics B. Lasers and Optics 80 (2005): 645-654.
Bison, Georg, Wynands, Robert, and Weis, Antoine. "Optimization and performance of an optical cardiomagnetometer" Journal of the Optical Society of America B 22.1 (2005): 77-87.

* cited by examiner

*Primary Examiner* — Bot Ledynh
(74) *Attorney, Agent, or Firm* — Canon U.S.A., Inc. IP Division

(57) ABSTRACT

An optical pumping magnetometer is provided that is capable of improving the response of the magnetometer with respect to a magnetic field that varies with a period shorter than the transverse relaxation time of electron spin of an alkali metal atom.

14 Claims, 10 Drawing Sheets

OPTICAL PUMPING MAGNETOMETER AND MAGNETIC SENSING METHOD

BACKGROUND

1. Field

The present subject matter relates to an optical pumping magnetometer and a magnetic sensing method.

2. Description of Related Art

As highly sensitive magnetic detection methods, optical pumping magnetometers have been proposed which use electron spin of alkali metal vapor.

Applied Physics B has disclosed an optical pumping magnetometer for detecting a magnetic field with the use of variation in Larmor frequency in a glass cell containing cesium.

In this optical pumping magnetometer, the electron spin motion of cesium vapor is caused by the oscillating magnetic field applied from an excitation coil, and changes the absorption of laser light passing depending on the orientation of spin polarization. The intensity of the transmitted laser light is detected by a photo-detector to obtain a signal that changes at the same frequency as the oscillating magnetic field. Attention is focused on the phase difference between the signal from the photo-detector and an electrical signal supplied to the excitation coil in order to generate the oscillating magnetic field to read the variation in Larmor frequency, and measure a magnetic field generated from an object to be measured.

In the optical pumping magnetometer of the conventional example described above, the transverse relaxation time T2 of the electron spin of the alkali metal vapor is a proportionality coefficient between the phase difference and the variation in Larmor frequency, and the response of the magnetometer with respect to the magnetic field generated from the object to be measured is thus improved as the transverse relaxation time is longer.

However, the conventional example has a problem that the response of the magnetometer is not improved even when the transverse relaxation time is increased in the case of measuring a variable magnetic field with a shorter variation period of the magnetic field generated from the object to be measured, as compared with the transverse relaxation time of the electron spin of the alkali metal vapor.

SUMMARY

An object of the present subject matter is, in view of the problem described above, to provide an optical pumping magneto meter and a magnetic sensing method which make it possible to improve the response of the magnetometer with respect to a magnetic field that varies with a period shorter than the transverse relaxation time of electron spin of an alkali metal atom and make highly sensitive measurements of magnetic signals when the magnetic field is measured with variation in Larmor frequency.

The optical pumping magnetometer according to the present subject matter is an optical pumping magnetometer for measuring a magnetic field with variation in Larmor frequency, which includes:

a unit configured to irradiate a cell with circularly polarized pumping light, to produce the cell containing alkali metal atoms and spin polarization of the alkali metal atoms in the cell;

a unit configured to emit linearly polarized probe light for reading spin of the alkali metal atoms;

a probe light detection system configured to detect a rotational displacement of a plane of polarization of the linearly polarized probe light;

a static magnetic field application coil configured to apply a static magnetic field to the alkali metal atoms;

an oscillating magnetic field application coil configured to applying an oscillating magnetic field for causing a rotational motion around the spin of the alkali metal atoms; and a unit configured to detect information including a phase difference between an output signal from the probe light detection system and a driving current input into the oscillating magnetic field application coil, wherein detuning as a difference between Larmor frequency determined from the static magnetic field and a frequency of the driving current input into the oscillating magnetic field application coil is configured to be set within a predetermined range with respect to a measured magnetic field by adjusting the static magnetic field or the oscillating magnetic field, so as to improve response of the optical pumping magnetometer.

Furthermore, the magnetic sensing method according to the present subject matter is a magnetic sensing method for measuring a magnetic field with variation in Larmor frequency, which includes:

carrying out circularly polarized optical pumping for producing a cell containing alkali metal atoms and spin polarization of the alkali metal atoms in the cell;

reading spin of the alkali metal atoms;

applying a static magnetic field to the alkali metal atoms;

applying an oscillating magnetic field for causing a rotational motion of the spin of the alkali metal atoms around the static magnetic field;

detecting information including a phase difference between an output signal obtained in the step of reading the spin of the alkali metal atoms and an input signal for generating the oscillating magnetic field in the step of applying oscillating magnetic field; and setting detuning as a difference between a Larmor frequency determined from the static magnetic field and a frequency of a driving current input into a coil to which the oscillating magnetic field is applied, within a predetermined range with respect to a measured magnetic field by adjusting the static magnetic field or the oscillating magnetic field, so as to improve response of the optical pumping magnetometer.

Furthermore, a program according to the present subject matter causes a computer to execute the magnetic sensing method described above.

Furthermore, a storage medium according to the present subject matter is readable by the computer with the above described program stored therein.

Further features of the present subject matter will become apparent from the following description of example embodiments (with reference to the attached drawings).

DETAILED DESCRIPTION

Figure 1:
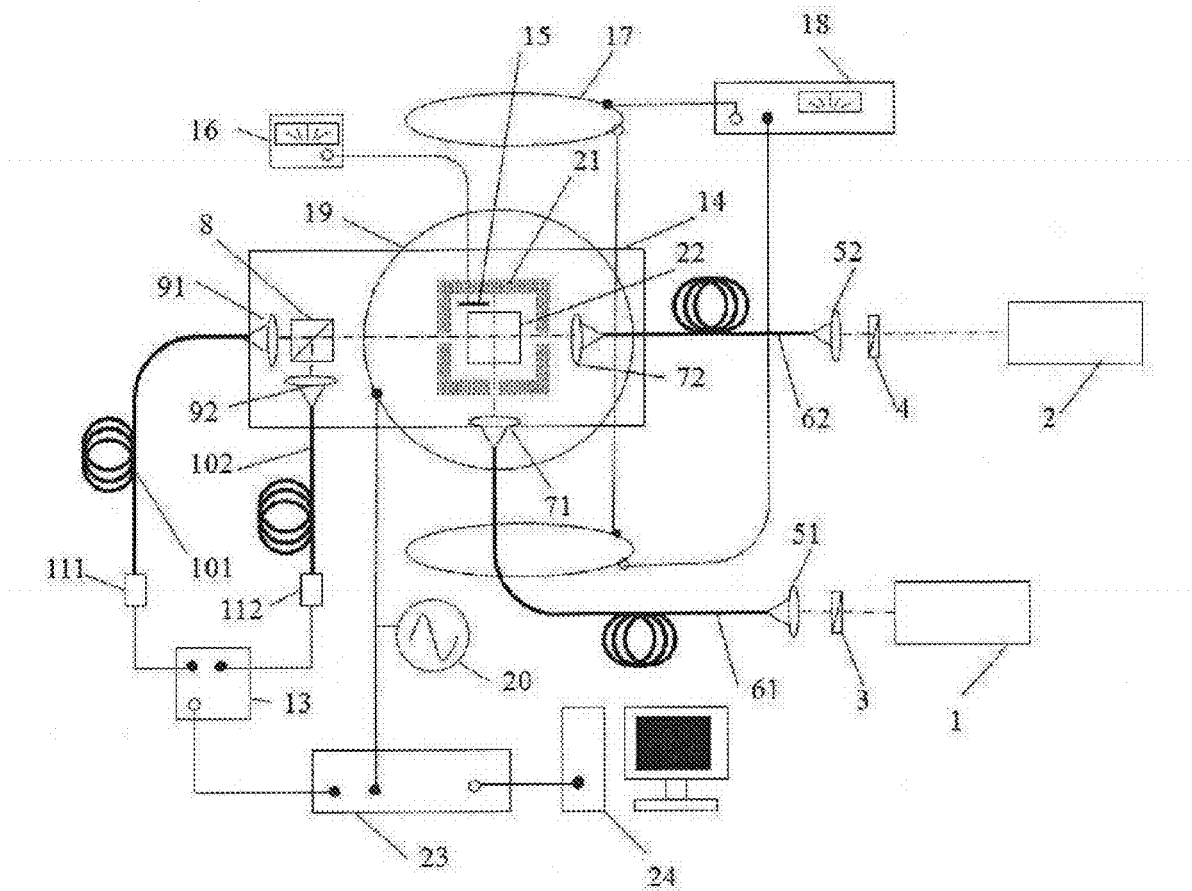
FIG. 1 is a diagram illustrating a configuration example of an optical pumping magnetometer according to example embodiment 1.

Embodiments for carrying out the present subject matter will be described with reference to the following example embodiments.

Example Embodiment 1

As example embodiment 1, a configuration example of an optical pumping magnetometer for measuring a magnetic field with variation in Larmor frequency through the application of the present subject matter will be described with reference to FIG. 1.

In the present example embodiment, with potassium as an alkali metal atom, optical pumping is carried out through the use of D1 transition of the potassium.

It is to be noted that D2 transition of the potassium may be used for optical pumping.

In addition, the alkali metal atom is not limited to potassium, but may be rubidium or cesium.

Potassium atoms, helium as a buffer gas for relaxing collisions between the potassium atoms and a glass wall of a glass cell 22, and nitrogen for quench are enclosed within the glass cell 22. The buffer gas is not limited to helium, but may be neon or argon.

In order to obtain a sufficient amount of potassium metal vapor in the glass cell, the glass cell 22 is heated up to on the order of 100° C. by a heater 15 that generates heat with an electric current supplied from a current source 16.

The glass cell 22 and the heater 15 are in an oven 21 composed of a member that has high thermal insulation performance.

The oven 21 is provided with a window for transmitting pump laser light and probe laser light.

An optical pumping laser light source 1 emits pump laser light that is linearly polarized light with a wavelength of 770.108 nm in vacuum, which is a wavelength resonant with the D1 transition of potassium.

The pump laser light is converted by a ¼ wavelength plate 3 into circularly polarized pumping light, coupled to an optical fiber 61 via a lens 51, and collimated through a lens 71 to irradiate the glass cell 22 containing the potassium atoms.

The pump laser light generates spin polarization of the potassium atoms in the glass cell 22. The wavelength of a probe laser light source 2, which is 769.9 nm, is shifted to shorter wavelengths than the resonant wavelength in the D1 transition of potassium.

In addition, the probe laser light source 2 emits probe laser light (linearly polarized probe light) that is linearly polarized light. The probe laser light passes through a ½ wavelength plate 4, and couples to an optical fiber 62 via a lens 52. The ½ wavelength plate 4 is provided for adjusting the orientation of the linearly polarized light of the probe laser light. The probe laser light propagates through the optical fiber 62, and is collimated through a lens 72 and emitted.

When the probe laser light passes through the window provided in the oven 21 and passes through the glass cell 22, the electron spin polarization of spin-polarized potassium atoms in the glass cell 22 produces a Faraday effect to rotationally displace the plane of linearly polarized light of the probe laser light.

It is to be noted that a coil 17 (static magnetic field application coil) applies a static magnetic field with a uniform intensity of 1.429 µT to the glass cell 22 parallel to the traveling direction of the pump laser light, with an electric current supplied from a current source 18.

Now, the Larmor frequency will be defined which corresponds to the static magnetic field.

The Larmor frequency is a frequency in precession of spin polarization placed in a static magnetic field with the orientation of the static magnetic field as a rotation axis, which is proportional to the magnitude of the magnetic field.

The Larmor frequency of spin polarization of a potassium atom is 10 kHz with respect to the static magnetic field of 1.429 µT.

However, as in the present example embodiment, in the optical pumping magnetometer which further applies an oscillating magnetic field by an excitation coil 19 (oscillating magnetic field application coil) as described next, the frequency of actual spin precession is not the Larmor frequency, but the same as that of the oscillating magnetic field. It is to be noted that the Larmor frequency of electron spin of the potassium atom is 10 kHz in the present example embodiment, but not limited thereto.

The excitation coil 19 applies an oscillating magnetic field to the glass cell 22 from a direction perpendicular to the paper in FIG. 1 with respect to the static magnetic field, with a driving current supplied from a signal generator 20.

The electron spin of the potassium atom in the glass cell 22 has motions at the same frequency as the frequency of the oscillating magnetic field applied, and the rotation of the plane of linearly polarized light of the probe laser light thus varies at the same frequency as the frequency of the oscillating magnetic field.

The frequency of the oscillating magnetic field applied from the excitation coil 19 or the frequency of the driving current supplied from the signal generator 20 will be described later.

Now, to explain a probe light detection system, a polarizing beam splitter 8 transmits P-wave polarized light of the probe laser light having passed through the glass cell 22, and reflects S-wave polarized light thereof.

The P-wave polarized light of the probe laser light, which is transmitted by the polarizing beam splitter 8, is coupled to an optical fiber 101 via a lens 91, and converted into an electrical signal by a photo-detector 111 at the end of the optical fiber 101.

In addition, the S-wave polarized light of the probe laser light, which is reflected by the polarizing beam splitter 8, is coupled to an optical fiber 102 via a lens 92, and converted into an electrical signal by a photo-detector 112 at the end of the optical fiber 102.

The electrical signals from the photo-detector 111 and photo-detector 112 are differentially amplified by a differential amplifier 13, and input into a phase detector 23.

In addition, the driving current from the signal generator 20 is partially branched and input as a voltage into the phase detector 23.

The phase detector 23 outputs an electrical signal that is proportional to a phase difference between the output of the differential amplifier 13 and the output of the signal generator 20. Then a personal computer 24 outputs a measured magnetic field signal subjected to digital calculation processing via an AD converter.

While the output of the electrical signal proportional to the phase difference from the phase detector 23 is used in the present example embodiment, the magnetic field can be also measured by using a 90° phase shift component of the output from the differential amplifier 13, with the driving current of the signal generator 20 as a reference signal.

For example, an output that is proportional to a sine component may be used in a two-phase lock-in amplifier.

It is to be noted that the oven 21, the glass cell 22, the heater 15, the lens 71, the lens 72, the polarizing beam splitter 8, the lens 91, and the lens 92 are fixed on a base 14, and further adapted so that the optical axes of the probe laser light and pump laser light are not shifted in the movement or conveyance of the base 14.

In addition, the optical fiber 61 and the optical fiber 62 may be polarization maintaining optical fibers for the purpose of suppressing polarization plane fluctuation of the probe laser light and pump laser light. In such a case, the pump laser light is coupled to the optical fiber 61, collimated through the lens 71, and then with the ¼ wavelength plate 3 placed, converted into circularly polarized light, while the pump laser light emitted from the optical pumping laser light source 1 is converted into circularly polarized light with the use of the ¼ wavelength plate 3 in the present example embodiment.

Likewise, the probe laser light is coupled to the optical fiber 62, collimated through the lens 72, and then with the ½ wavelength plate 4 placed, subjected to the orientation adjustment of linearly polarized light, while the probe laser light emitted from the probe laser light source 2 is subjected to the orientation adjustment of the linearly polarized light with the use of the ½ wavelength plate 4.

Next, the relations between the response of the optical pumping magnetometer according to the present subject matter and the frequency and T2 of a measured magnetic field will be described in detail, and the effect of improved response will be then described on the basis of the results of experiments carried out by the inventors.

Here, the difference between the Larmor frequency of the electron spin of the potassium atom, which is determined from the static magnetic field, and the frequency of the driving current of the oscillating magnetic field input into the excitation coil 19 (oscillating magnetic field application coil) is defined as detuning.

Figure 2:
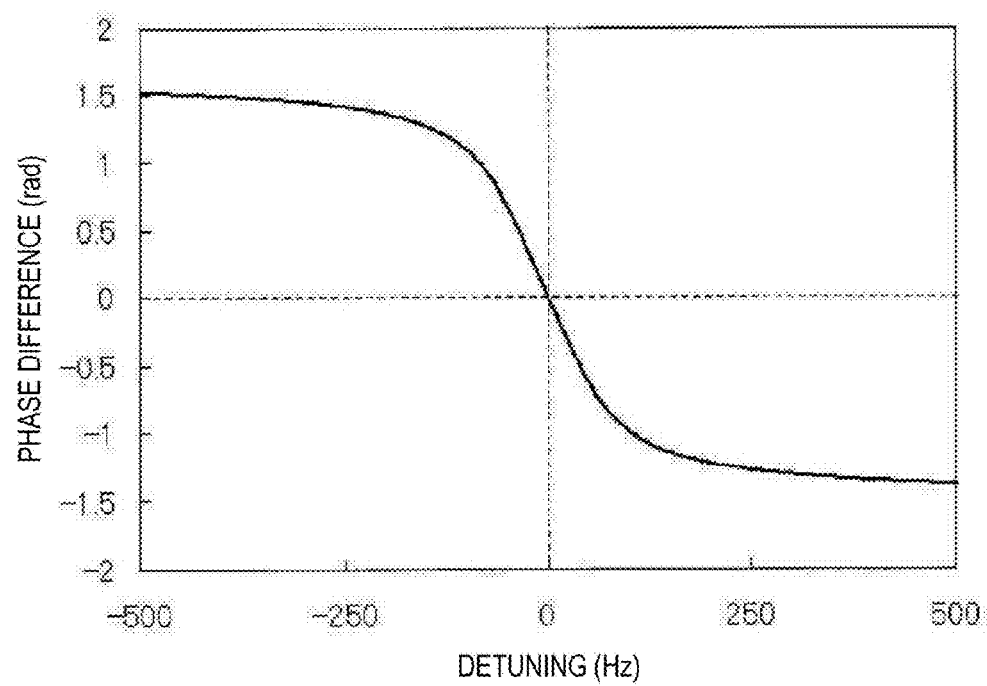
FIG. 2 is a graph showing the relation between detuning and the phase difference between a rotational displacement of a plane of linearly polarized light produced when probe laser light passes through a glass cell and a oscillating magnetic field applied from an excitation coil, according to example embodiment 1.

FIG. 2 shows the relation between detuning and the phase difference between the rotational displacement of the plane of linearly polarized light produced when the probe laser light passes through the glass cell 22 and the oscillating magnetic field applied from the excitation coil 19.

The detuning and the phase difference are proportional to each other near zero detuning. The rotational displacement of the plane of linearly polarized light of the probe laser light is caused by the motion of the electron spin of the potassium atom, and the relation between the detuning and the phase difference can be thus derived by solving the Bloch equation for the electron spin of the potassium atom.

For example, Mx' and My' are used which are solutions of the Bloch equation mentioned in Pulse and Fourier Transform NMR. Mx' and My' are an x component and a y component of macroscopic magnetization in an orthogonal coordinate system, and Mx'/My' can be approximated as a phase value when Mx'/My' has a small value.

From the foregoing, the relationship between detuning and the phase difference in the case of the detuning near zero is expressed by a proportional relation as in Formula 1.

$$dp = T2*(w0-w) \qquad \text{Formula 1}$$

where dp is a phase difference, w0 is a Larmor angular frequency of electron spin of a potassium atom, w is an angular frequency in an oscillating magnetic field, and T2 is transverse relaxation time of the electron spin of the potassium atom in the glass cell 22.

From Formula 1, it is understood that a larger phase difference is produced with respect to detuning, as T2 increases.

In addition, the Larmor frequency varies depending on the measured magnetic field applied in the direction of applying the static magnetic field, thereby resulting in variation in detuning, and the response of the optical pumping magnetometer with respect to the measured magnetic field is thus improved as T2 is longer.

It is known that T2 of the electron spin of the potassium atom in the glass cell 22 depends on the size and shape of the glass cell 22, the intensity of the pump laser light with which the glass cell 22 is irradiated, the amount of the buffer gas enclosed in the glass cell 22, the amount of the potassium atom gas generated by heating the glass cell 22, etc.

Figure 3:
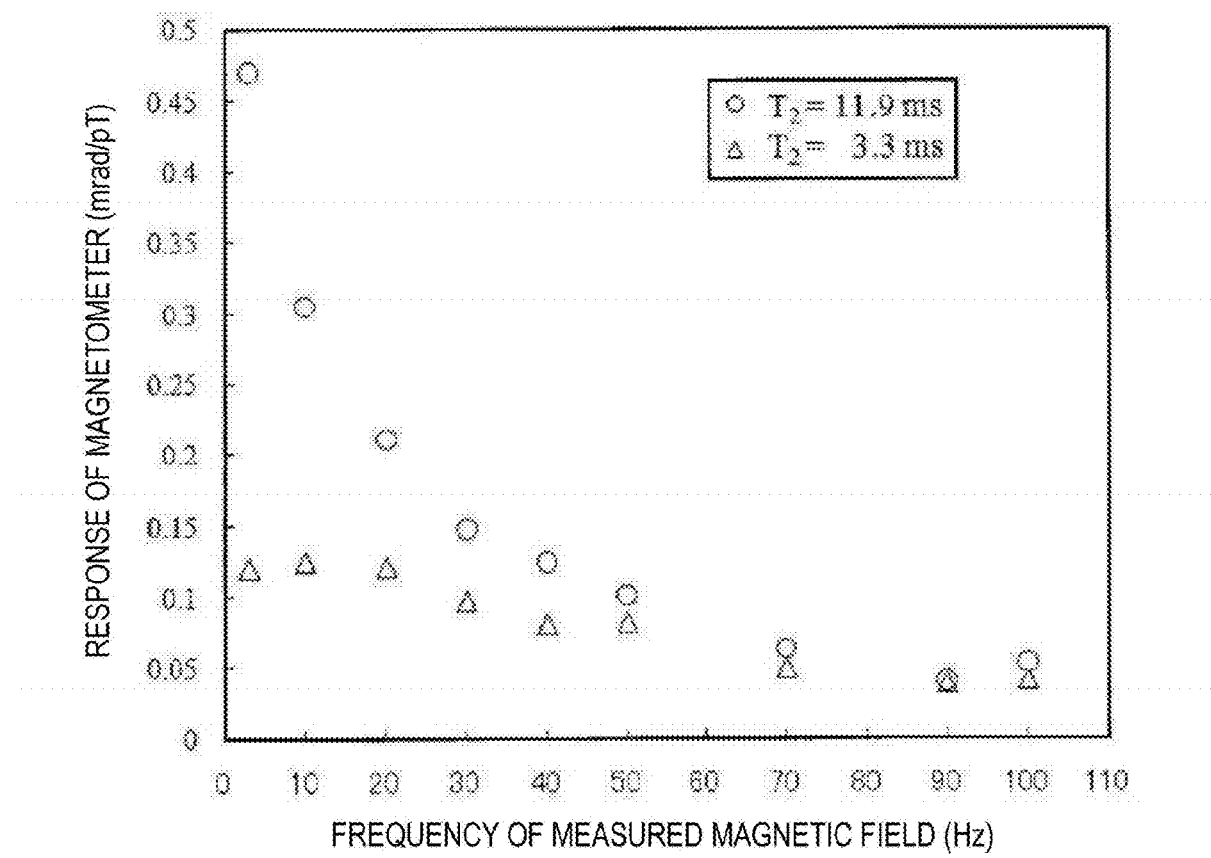
FIG. 3 is a graph showing results obtained from experiments on the frequency of a measured magnetic field and the response of an optical pumping magnetometer, according to example embodiment 1.

FIG. 3 shows results obtained from experiments on the frequency of the measured magnetic field and the response of the optical pumping magnetometer.

FIG. 3 shows actual measured results for T2, and two different measurements were obtained for T2 as a result of varying the temperature of the glass cell 22 to change the amount of the potassium atom gas.

In obtaining these measurements, the frequency of the oscillating magnetic field was 10 kHz with zero detuning with respect to the Larmor frequency of 10 kHz.

When the response of the optical pumping magnetometer was compared between T2 values of 3.3 ms and 11.9 ms at 3 Hz for the frequency of the measured magnetic field, the response in the case of T2 of 11.9 ms was improved about four times as much as in the case of T2 of 3.3 ms.

However, as the frequency of the measured magnetic field increased, the response ratio of the optical pumping magnetometer in the case of T2 of 11.9 ms relative to the case of T2 of 3.3 ms decreased.

In particular, at frequencies of 50 Hz or more, no significant improvement in response was seen.

In addition, from the plots in FIG. 3, the frequency at which the response of the optical pumping magnetometer becomes half the response of that in the case of 3 Hz for the frequency of the measured magnetic field is 50 Hz in the case of T2 of 3.3 ms, and 20 Hz in the case of T2 of 11.9 ms.

This can be understood from the relation described in the *Journal of the Optical Society America B*. The relation between T2 and a cutoff frequency fc can be expressed as in Formula 2.

$$fc = 1/(2\pi * T2)$$  Formula 2

Namely, as T2 is longer, the cutoff frequency is lower, and the frequency range of the measured magnetic field is narrower in which the optical pumping magnetometer achieves great responses.

Therefore, in a measured magnetic field which varies with a shorter period with respect to T2, or at a higher frequency with respect to the cutoff frequency fc expressed by Formula 2, the response of the optical pumping magnetometer is not improved even when T2 is made longer with detuning remaining zero.

Figure 4:
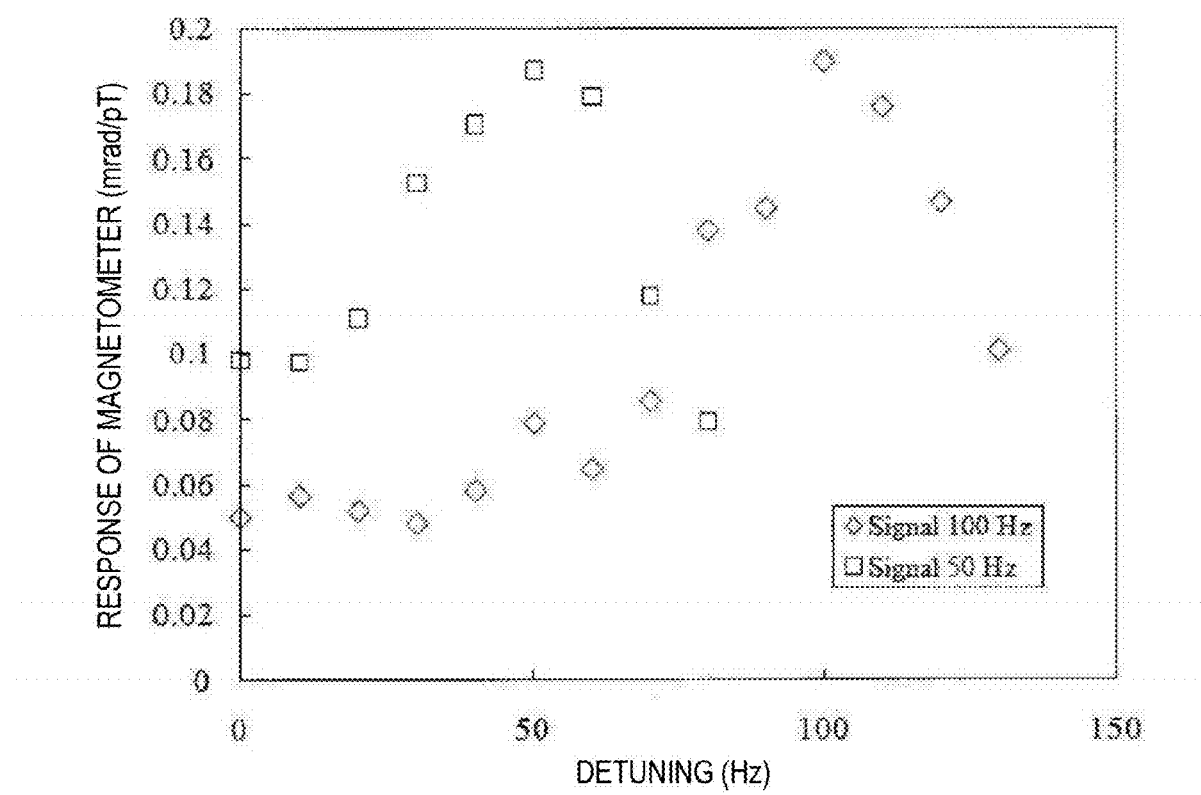
FIG. 4 is a graph showing results obtained by experiments on the response of an optical pumping magnetometer and detuning of an oscillating magnetic field from a Larmor frequency, according to example embodiment 1.

FIG. 4 is obtained by plotting results obtained by experiments on the response of the optical pumping magnetometer with respect to detuning in the case of T2 of 11.9 ms.

It is to be noted that while the frequency of the oscillating magnetic field is varied in order to show the effect according to the present example embodiment in FIG. 4, the frequency of the oscillating magnetic field is fixed in the case of practice according to the present example embodiment.

In FIG. 4, the frequencies of the measured magnetic field are 50 Hz and 100 Hz, which are higher than the cutoff frequency 13.4 Hz obtained from the (Formula 2) in the case of T2 of 11.9 ms.

When the detuning was increased, the response of the optical pumping magnetometer was improved to reach a maximum at 50 Hz and 100 Hz at which the frequency of each measured magnetic field was coincident with the detuning.

In addition, the response of the optical pumping magnetometer was improved up to twice as much as in the case of zero detuning with respect to the frequency 50 Hz of the measured magnetic field, and up to four times as much as in the case of zero detuning with respect to the frequency 100 Hz of the measured magnetic field.

The fact that response of the optical pumping magnetometer reaches a maximum when the detuning is coincident with the frequency of the measured magnetic field can be also derived by solving the Bloch equation for the electron spin of the potassium atom.

For example, the Bloch equation in an orthogonal coordinate system rotating at the angular frequency w in the oscillating magnetic field can be expressed in a matrix form as in Formula 3, as described in Pulse and Fourier Transform NMR.

$$dM/dt = AM + \begin{pmatrix} 0 \\ 0 \\ M0/T1 \end{pmatrix}$$  Formula 3 where M is a three-dimensional vector indicating spin magnetization, which has an x component, a y component, and a z component. M0 is an equilibrium value of magnetization, and A is an interaction matrix, which can be expressed as in Formula 4.

$$A = \begin{pmatrix} -1/T2 & -dw & 0 \\ dw & -1/T2 & w1 \\ 0 & -w1 & -1/T1 \end{pmatrix}$$  Formula 4 where dw is detuning expressed by an angular frequency, T1 is longitudinal relaxation time, and w1 is an angular frequency determined by an intensity H1 of the oscillating magnetic field and a gyromagnetic ratio γ of the electron spin of the potassium atom, which can be expressed as in Formula 5.

$$w1 = \gamma H1$$  Formula 5

The static magnetic field is applied in the z direction, whereas the oscillating magnetic field is applied in the x direction. It is to be noted that the magnitude of w1 is on the order of 0.7 Hz, due to the fact that in the optical pumping magnetometer the intensity of the oscillating magnetic field is on the order of 0.1 nT, with the magnitude of 7 GHz/T for the electron spin of the potassium atom.

Furthermore, the interaction matrix A and the magnetization M vary depending on time, due to the measured magnetic field applied in the direction of the static magnetic field. Here, the interaction matrix A can be expressed as in the following (Formula 6), with a term Ae(t) dependent on time and a term Ai independent of time.

$$A(t) = Ai + Ae(t)$$  Formula 6

Likewise, the magnetization M can be expressed as in the following (Formula 7), with a term Me(t) dependent on time and a term Mi independent of time.

$$M(t) = Mi + Me(t)$$  Formula 7

Formula 6 and Formula 7 can be substituted into Formula 3 to express the term dependent on time as in Formula 8.

$$dMe(t)/dt = AiMe(t) + Ae(t)Mi$$  Formula 8

When T1 is equal to T2, the interaction matrix A has eigenvalues r1, r2, and r3 as in the following (Formula 9), where j indicates an imaginary number.

$$\begin{pmatrix} r_1 \\ r_2 \\ r_3 \end{pmatrix} = \begin{pmatrix} -(T2)^{-1} \\ -(T2)^{-1} - j(w1^2 + dw^2)^{1/2} \\ -(T2)^{-1} + j(w1^2 + dw^2)^{1/2} \end{pmatrix}$$  Formula 9

In addition, Me(t) is expressed as in Formula 10, with the use of the eigenvectors L1, L2, and L3 corresponding to the eigenvalues.

$$Me(t) = \Sigma_{k=1}^{3} Tk(t) Lk$$  Formula 10

Tk(t) is a coefficient indicating the magnitude for each eigenvector component, which is a function of time. The respective components are represented as in Formula 11 with k=1, 2, 3, by substituting Formula 10 into Formula 9, and further calculating inner products with the eigenvectors L1, L2, and L3.

$$dTk(t)/dt = Tk(t) + Lk \cdot (Ae(t)Mi)$$  Formula 11

Here, the measured magnetic field is regarded as a magnetic field in the z direction that oscillates at an angular frequency wm, with amplitude Hs. Ae(t) can be expressed as in the following (Formula 12).

$$Ae(t) = U\cos(wmt)$$  Formula 12

U can be expressed as in the following (Formula 13), with the use of we=γHs.

$$U = \begin{pmatrix} 0 & -we & 0 \\ we & 0 & 0 \\ 0 & 0 & 0 \end{pmatrix} \quad \text{Formula 13}$$

It is understood that, the time change Ae(t) of the interaction matrix has elements that are not zero, for the term to which the static magnetic field in the z direction contributes, that is, elements of the detuning dw among the elements of the interaction matrix A. Furthermore, with k=1, 2, 3, the following (Formula 14) is obtained.

$$Lk \cdot UM0 = Uk \quad \text{Formula 14}$$

Thus, the solution of the differential equation of Formula 11 is expressed as in the following (Formula 15).

$$T_k(t) = \mathrm{Exp}(rkt)Tk(0) + Uk(-rk\cos(wmt) + wm\sin(wmt))/(rk^2 + wm^2) \quad \text{Formula 15}$$

From Formula 9 mentioned above, the eigenvalues have negative real parts, and the first term of Formula 15 is thus attenuated with time.

Therefore, only the second term of Formula 15 is left as the influence on the variation in Ae(t), and expressed as in the following (Formula 16).

$$Me(t) = \Sigma_{k=1}^{3} Uk \cos(wmt + dk)/(rk^2 + wm^2)^{1/2} \quad \text{Formula 16}$$

where d1, d2, and d3 are phases, which are determined by the eigenvalues r1, r2, and r3 and the angular frequency wm. The eigenvalues r1, r2, and r3 of the interaction matrix A are substituted into Formula 16, and w1 on the order of 0.7 Hz is ignored with respect to dw, thereby providing the following (Formula 17).

$$Me(t) = U1\cos(wmt+d1)L1/((T2)^{-2}+wm^2+wm^2) + \sum_{k=2}^{k=3} \frac{Uk[\cos(wmt+d'k)\cosh(d''k) + j\sin(wmt+d'k)\sinh(d''k)]}{(wm^2 - dw^2 + (T2)^{-2} + (-1)^{k-1}j2dw/T2)^{1/2}} Lk$$

Formula 17 d'2, d'3 and d"2, d"3 are respectively real parts and imaginary parts of d1 and d2. Now, consideration will be focused on the second term which varies with respect to dw from Formula 17. For k=2, 3, the real part and imaginary part of the phase dk are expressed as in the following Formula 18 from Formula 9 and Formula 15.

$$dk = d'k + jd''k \quad \text{Formula 18}$$
$$= \tan^{-1}\left[\frac{(T2^{-1} + (-1)^k jdw)}{wm}\right]$$
$$= \frac{j}{2}\log\left[\frac{1+(-1)^k(dw/wm) - j(T2wm)^{-1}}{1+(-1)^{k-1}(dw/wm) - j(T2wm)^{-1}}\right]$$

From Formula 18, when the detuning dw is equal to the angular frequency wm, d"2 and d"3 reach a local maxima. Furthermore, when d"2 and d"3 reach a maximum, the hyperbolic function of Formula 17 also reaches a maximum, and Me(t) indicating the variation in magnetization with respect to time thus reaches a maximum.

Therefore, when the angular frequency wm of the variation in Ae(t) coincides with the detuning dw at the angular frequency, the amplitude of the variation in magnetization reaches a maximum.

The variation in Ae(t) results from the measured magnetic field oscillating at the angular frequency wm, and thus, when the angular frequency of the measured magnetic field coincides with the detuning dw at the angular frequency, the variation in the electron spin of the potassium atom reaches a maximum, and the response of the optical pumping magnetometer with respect to the measured magnetic field reaches a maximum.

Thus far, the effect of the present subject matter has been described by solving the Bloch equation for spin magnetization on the optical pumping magnetometer.

For the Bloch equation, the direction of the static magnetic field applied is considered in the rotating coordinate system rotating at the frequency of the oscillating magnetic field around the rotation axis.

As perturbation dependent on time, a measured magnetic field is added thereto, which oscillates at the angular frequency wm in the same direction as the static magnetic field.

In order to obtain a first-order perturbation solution of the Bloch equation, which is dependent on time, the equation was expanded with eigenvectors of the interaction matrix, which are independent of time to examine the behavior of perturbation solution for each eigenvector.

As a result, as expressed by Formula 17 and Formula 18, the formulas have shown that when the angular frequency wm of the measured magnetic field coincides with the angular frequency dw of the detuning, the amplitude of the magnetization vector reaches a maximum, in the perturbation solution with which magnetization oscillates at the angular frequency wm corresponding to the eigenvectors L2 and L3.

Figure 5:
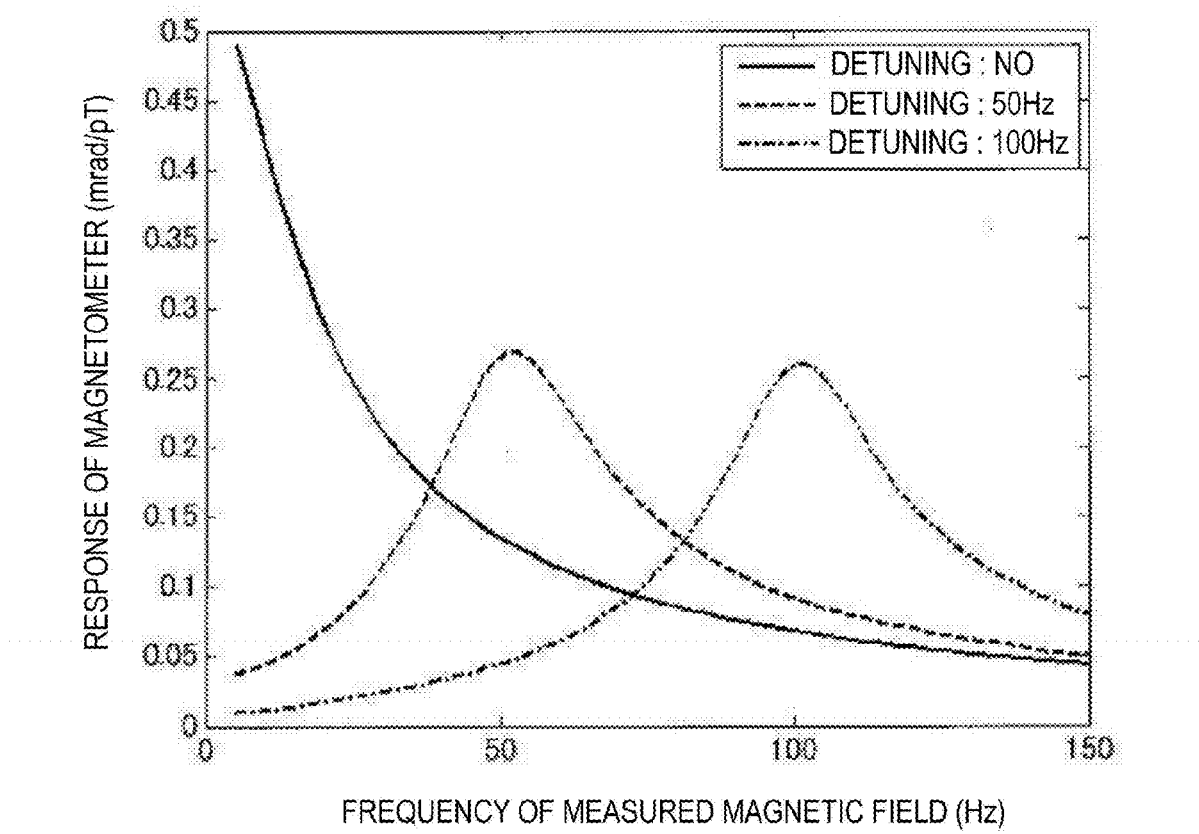
FIG. 5 is a graph showing the relation between the response of an optical pumping magnetometer and the frequency of a measured magnetic field in a detuned oscillating magnetic field, according to example embodiment 1.

FIG. 5 is a graph obtained by plotting results calculated for the response of the optical pumping magnetometer and the frequency of the measured magnetic field, in the case of 50 Hz and 100 Hz for the detuning of the oscillating magnetic field, and no detuning.

While the optical pumping magnetometer achieves the best response when the frequency of the measured magnetic field coincides with the detuning as described above, detuning within the range of ±20% with respect to the frequency of the measured magnetic field is preferred from FIG. 5, in a frequency region in which the response of the magnetometer in the case of detuning is improved more than the response in the case of no detuning.

For example, when the frequency of the measured magnetic field is 50 Hz, the detuning preferably ranges from 40 Hz to 60 Hz, and when the frequency is 100 Hz, the detuning preferably ranges from 80 Hz to 120 Hz.

As described above, in order to set the detuning within a predetermined range, it is possible to set the detuning by adjusting the static magnetic field or the oscillating magnetic field.

Specifically, the static magnetic field can be adjusted by adjusting a value of the current input into the coil 17.

In addition, the oscillating magnetic field can be adjusted by adjusting the frequency of the current input into the excitation coil 19.

From the foregoing, in the case of detecting 100 Hz among frequency components of the measured magnetic field, the frequency of the driving current in the signal generator 20 is set at 10.1 kHz or 9.9 kHz so that the detuning is 100 Hz.

Alternatively, a current may be supplied to the coil 17 from the current source 18 so that Larmor frequency of the electron spin of potassium atom is 9.9 kHz or 10.1 kHz while the frequency of the driving current in the signal generator 20 is set at 10 kHz.

In addition, a current may be supplied to the coil 17 from the current source 18 so that the static magnetic field intensity is 1.41 µT or 1.45 µT while the frequency of the driving current in the signal generator 20 is set at 10 kHz.

In addition, in the case of detecting 100 Hz among the frequency components of the measured magnetic field, the detuning may fall within the range from 80 Hz to 120 Hz.

The frequency of the driving current in the signal generator 20 is set within the range from 10.08 kHz to 10.12 kHz or from 9.88 kHz to 9.12 kHz.

Alternatively, a current may be supplied to the coil 17 from the current source 18 so that Larmor frequency of the electron spin of potassium atom is in the range from 10.08 kHz to 10.12 kHz or from 9.88 kHz to 9.92 kHz while the frequency of the driving current in the signal generator 20 is set at 10 kHz.

In addition, a current may be supplied to the coil 17 from the current source 18 so that the static magnetic field intensity falls in the range from 1.440 µT to 1.446 µT or the range from 1.411 µT to 1.417 µT while the frequency of the driving current in the signal generator 20 is set at 10 kHz.

While the effect of the present subject matter has been described in the case of 50 Hz and 100 Hz for the frequency of the measured magnetic field in the present example embodiment, the effect is not limited to these frequencies.

Figure 6:
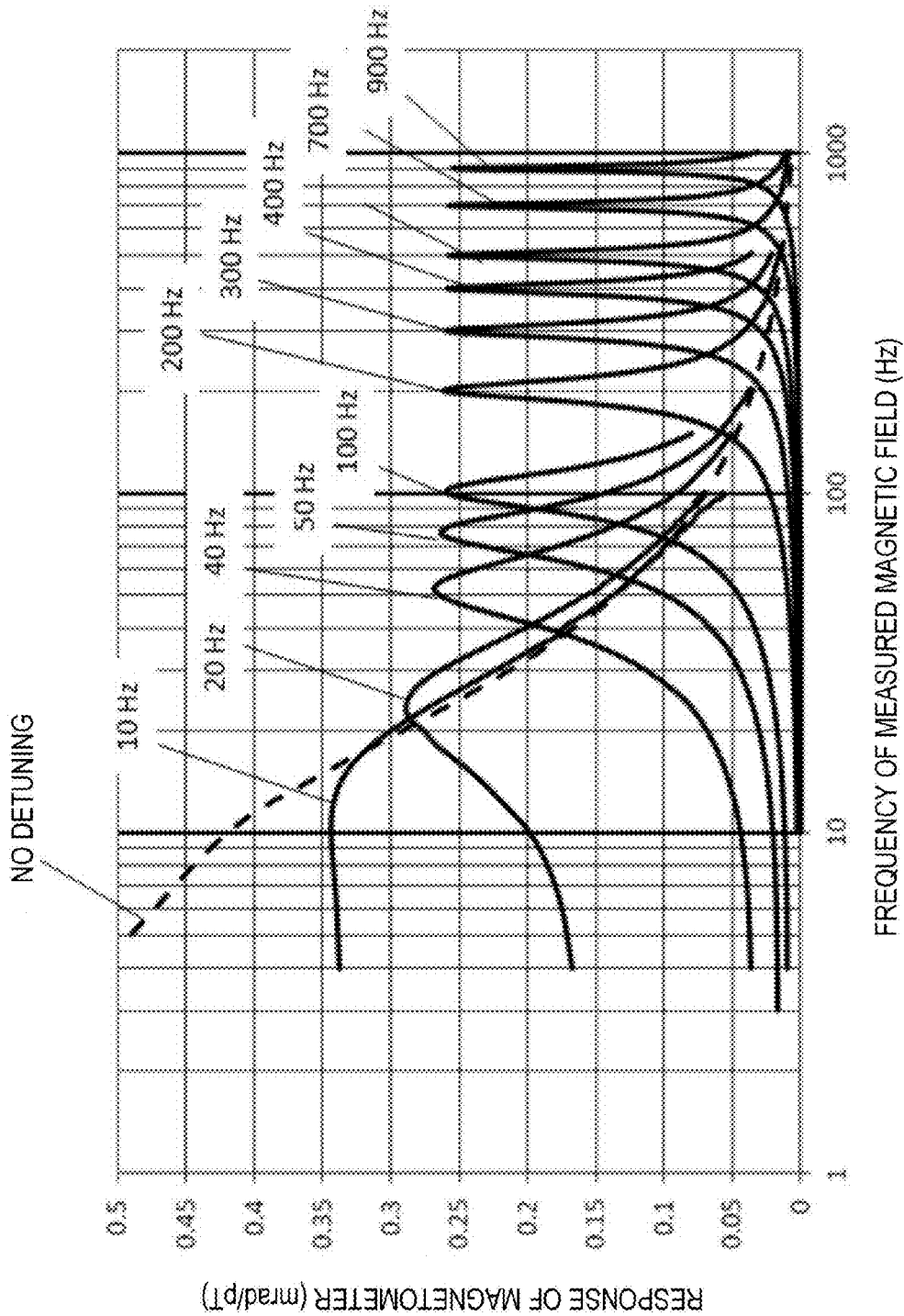
FIG. 6 is a graph showing the relation between the response of an optical pumping magnetometer and the frequency of a measured magnetic field, including a case of detuning an oscillating magnetic field by 100 Hz or more, according to example embodiment 1.

FIG. 6 is a graph obtained by plotting results calculated for the response of the optical pumping magnetometer and the frequency of the measured magnetic field in the case of 10 Hz, 20 Hz, 40 Hz, 50 Hz, 100 Hz, 200 Hz, 400 Hz, 700 Hz and 900 Hz for the detuning of the oscillating magnetic field, and no detuning. Even when the frequency of the measured magnetic field is 100 Hz or more, it is possible to improve the response of the optical pumping magnetometer without detuning by application of detuning of the same magnitude as the frequency of the measured magnetic field.

In addition, while the oscillating magnetic field of single frequency has been described by way of example as the measured magnetic field, the measurement may be performed through the application of detuning of 50 Hz to a magnetic field with a power spectrum extending in a band from 40 Hz to 60 Hz.

In addition, magnetic fields of frequencies different from each other may be subjected to the measurement in such a way that more than one optical pumping magnetometer as described above is provided so that respective detuning in the optical pumping magnetometers differs from each other within a predetermined range with respect to the measured magnetic field.

In addition, while the optical pumping magnetometer has been described above, the principle described above can be used to achieve the following magnetic sensing method which makes it possible to improve the response of the magnetometer and make highly sensitive measurements of magnetic signals.

Namely, the magnetic sensing method can be achieved which includes: carrying out circularly polarized optical pumping for producing a cell containing an alkali metal atoms and spin polarization of the alkali metal atoms in the cell; reading spin of the alkali metal atoms; applying a static magnetic field to the alkali metal atoms; applying an oscillating magnetic field for causing a rotational motion of the spin of the alkali metal atoms around the static magnetic field; detecting information including a phase difference between an output signal obtained in reading the spin of the alkali metal atoms and an input signal for generating the oscillating magnetic field in the oscillating magnetic field application; and setting detuning as a difference between Larmor frequency determined from the static magnetic field and a frequency of a driving current input into a coil to which the oscillating magnetic field is applied, within a predetermined range with respect to a measured magnetic field by adjusting the static magnetic field or the oscillating magnetic field, so as to improve responsiveness of the optical pumping magnetometer, where the detuning indicates.

In that regard, the magnetic sensing method described above can be programmed, or this program can be stored on a computer-readable storage medium to cause a computer to execute the program.

Example Embodiment 2

As example embodiment 2, a configuration example of applying an optical pumping magnetometer according to the present subject matter to a biomagnetic measurement will be described with the reference to FIG. 7.

Figure 7:
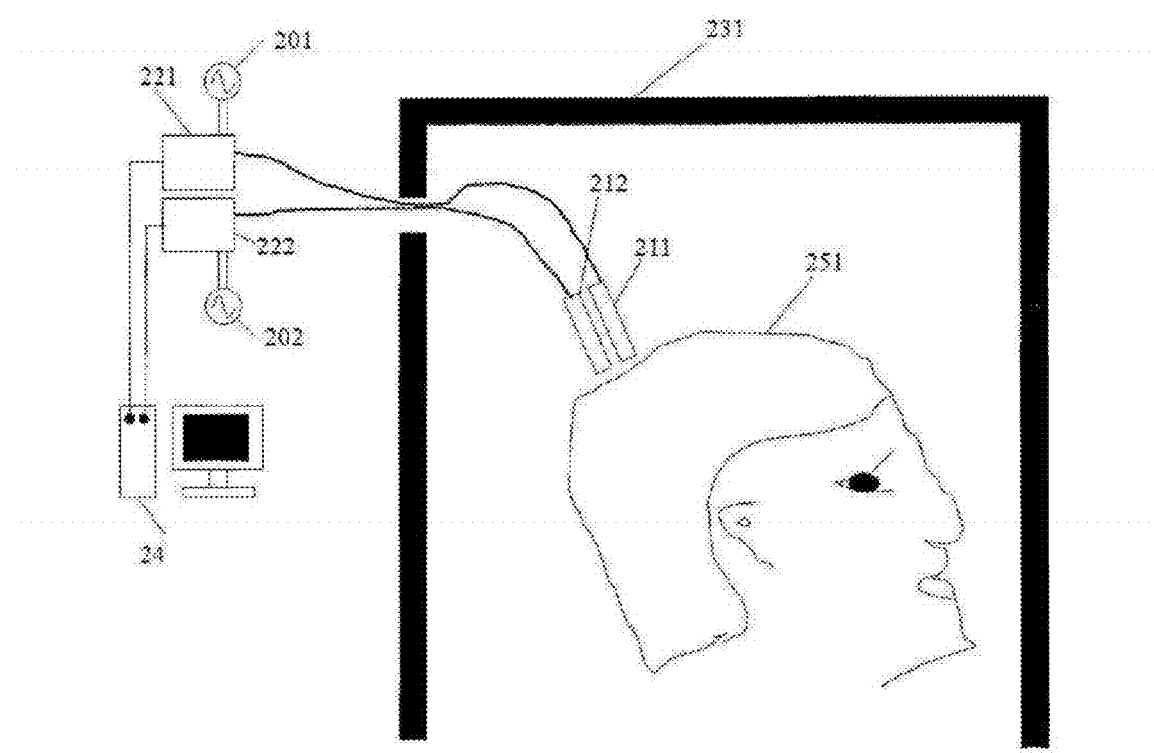
FIG. 7 is a diagram illustrating a configuration example of applying an optical pumping magnetometer according to example embodiment 2 to a biomagnetic measurement.

In the biomagnetic measurement according to the present example embodiment, as shown in FIG. 7, a weak magnetic field generated by brain activity or the like from a head 251 of a subject is measured with a magnetic sensor unit 211 and a magnetic sensor unit 212. The magnetic sensor unit 211 and the magnetic sensor unit 212 as well as the subject are placed in a magnetic shield 231 for shielding against geomagnetism and magnetic fields in external environments.

A sensor electric unit 221 is connected with an optical fiber or cable via an opening provided in the magnetic shield 231 to the magnetic sensor unit 211.

In addition, a signal generator 201 that generates a driving current for applying an oscillating magnetic field is connected to the sensor electric unit 221.

Likewise, a sensor electric unit 222 is connected to the magnetic sensor unit 212, and a signal generator 202 is connected to the sensor electric unit 222.

The outputs from the sensor electric unit 221 and sensor electric unit 222 are fed into a personal computer 24 via an AD converter, and output as magnetic measurement results.

Next, the configuration of the sensor electric unit 221 and magnetic sensor unit 211 will be described. The principle for detecting a weak magnetic field here is the same as in example embodiment 1.

Figure 8:
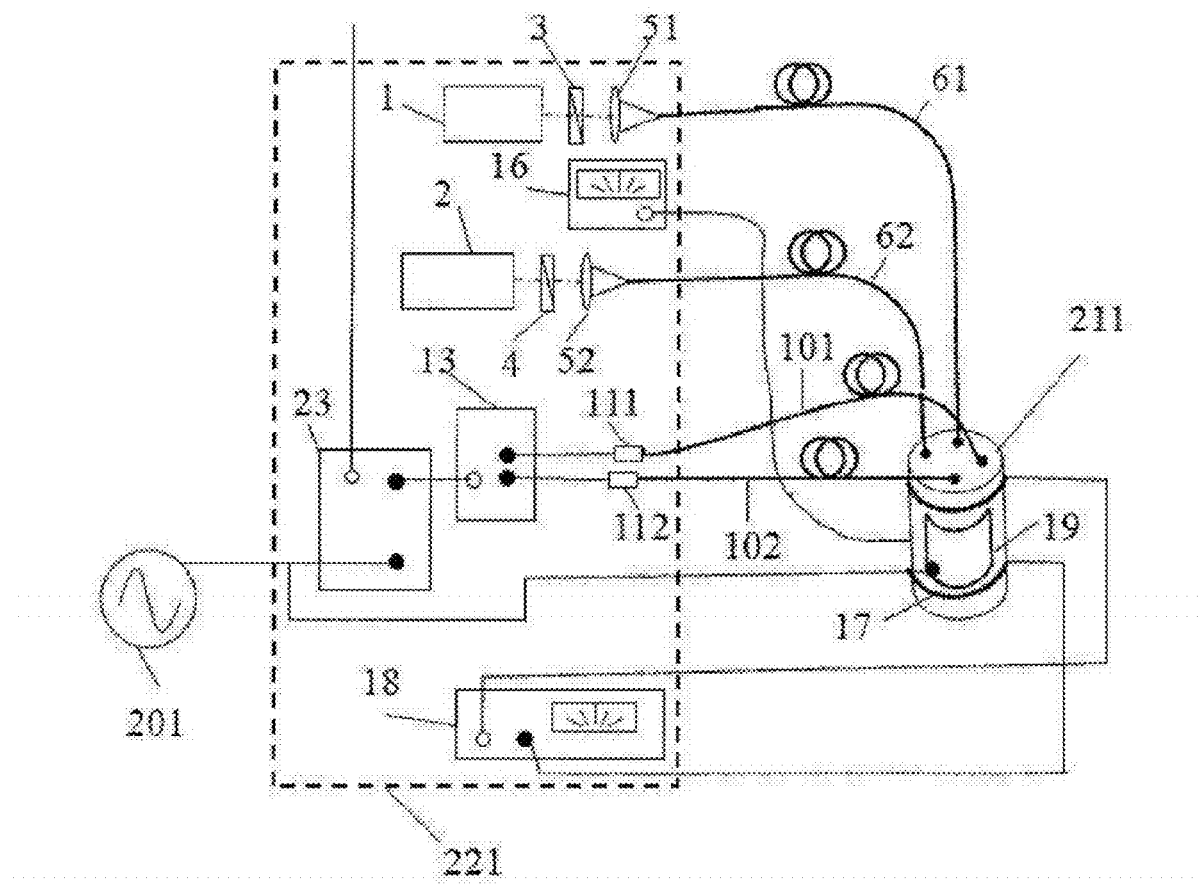
FIG. 8 is a diagram illustrating a relation of connection between the configuration of a sensor electric unit and a magnetic sensor unit according to example embodiment 2.

FIG. 8 shows a relation of connection between the sensor electric unit 221 and the magnetic sensor unit 211.

It is to be noted that the relation of connection between the sensor electric unit 222 and the magnetic sensor unit 212 is also shown in a similar fashion.

Pump laser light output from an optical pumping laser light source 1 enters the magnetic sensor unit 211 via a ¼ wavelength plate 3, a lens 51, and an optical fiber 61.

A probe laser light source 2 makes light incident on the magnetic sensor unit 211 via a ½ wavelength plate 4, a lens 52, and an optical fiber 62.

A current source 18 is connected to a coil 17, and applies a uniform static magnetic field intensity of 1.429 µT so that Larmor frequency of the electron spin of the potassium atom is 10 kHz.

It is to be noted that the magnetic sensor unit 211 and the sensor electric unit 221 detect a component in the direction of the static magnetic field applied by the coil 17, among a weak magnetic field generated in the head 251 of the subject.

An excitation coil 19 applies an oscillating magnetic field with a driving current supplied from the signal generator 201.

Probe laser light emitted from the magnetic sensor unit 211 is partially, via an optical fiber 101, converted to an electrical signal in a photo-detector 111.

In addition, probe laser light emitted from the magnetic sensor unit 212 is partially, via an optical fiber 102, converted to an electrical signal in a photo-detector 112.

The electrical signals from the photo-detector 111 and photo-detector 112 are input into a phase detector 23 via a differential amplifier 13.

In addition, the driving current from the signal generator 201 is partially input into the phase detector 23, and an electrical signal proportional to the phase difference from the output of the differential amplifier 13 is output as the output of the sensor electric unit 221 to the personal computer 24 in FIG. 7.

Figure 9:
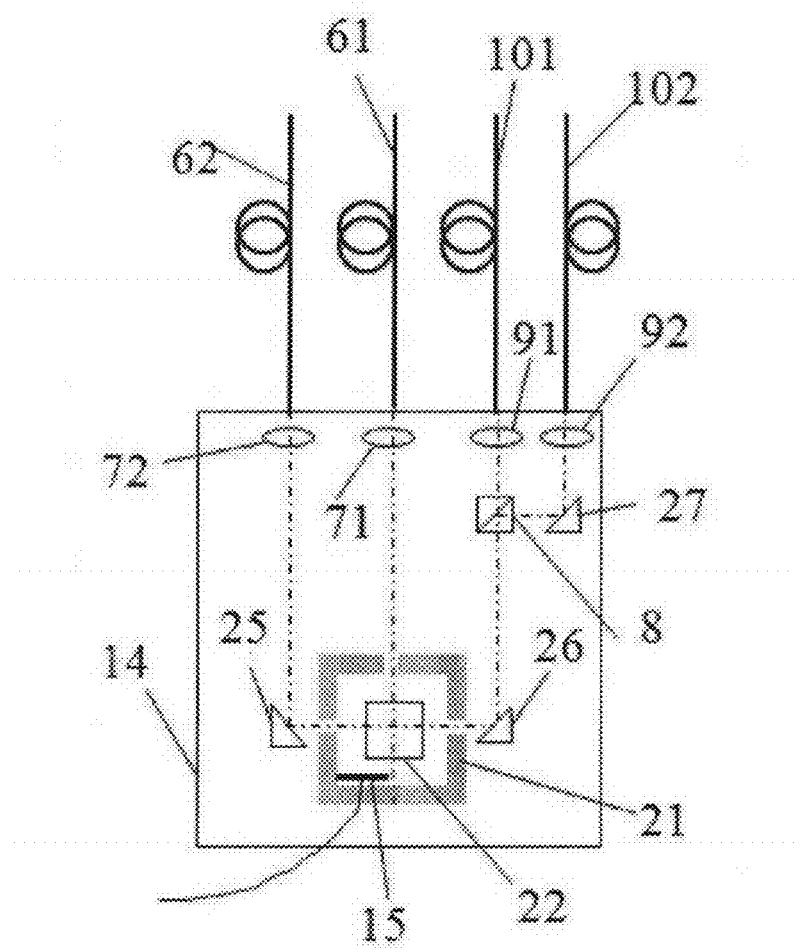
FIG. 9 is a diagram illustrating the configuration of a magnetic sensor unit according to example embodiment 2.

FIG. 9 shows the configuration of the magnetic sensor unit 211. It is to be noted that the configuration of the magnetic sensor unit 212 is also shown in a similar fashion.

A glass cell 22 is housed in an oven 21, and heated to on the order of approximately 100° C. by a heater 15 connected to a current source 16 in FIG. 8.

The glass cell 22 is irradiated with pump laser light via a lens 71. Probe laser light is, via a lens 72, reflected by a mirror 25, passed through the glass cell 22, reflected by a mirror 26 to enter a polarizing beam splitter 8.

P-wave polarized light of the probe laser light is transmitted by the polarizing beam splitter 8, and coupled to the optical fiber 101 via a lens 91. In addition, S-wave polarized light reflected by the polarizing beam splitter is reflected by a mirror 27, and coupled to the optical fiber 102 via a lens 92.

It is to be noted that the oven 21, the glass cell 22, the heater 15, the lens 71, the lens 72, the polarizing beam splitter 8, the lens 91, the lens 92, the mirror 25, the mirror 26, and mirror 27 are fixed on a base 14, and further adapted so that the optical axes of the probe laser light and pump laser light are not shifted with the movement or conveyance of the magnetic sensor unit 211.

The driving current from the signal generator 201 connected to the sensor electric unit 221 is 10 kHz, which coincides with the Larmor frequency of the electron spin of the potassium atom in the glass cell 22.

Figure 10:
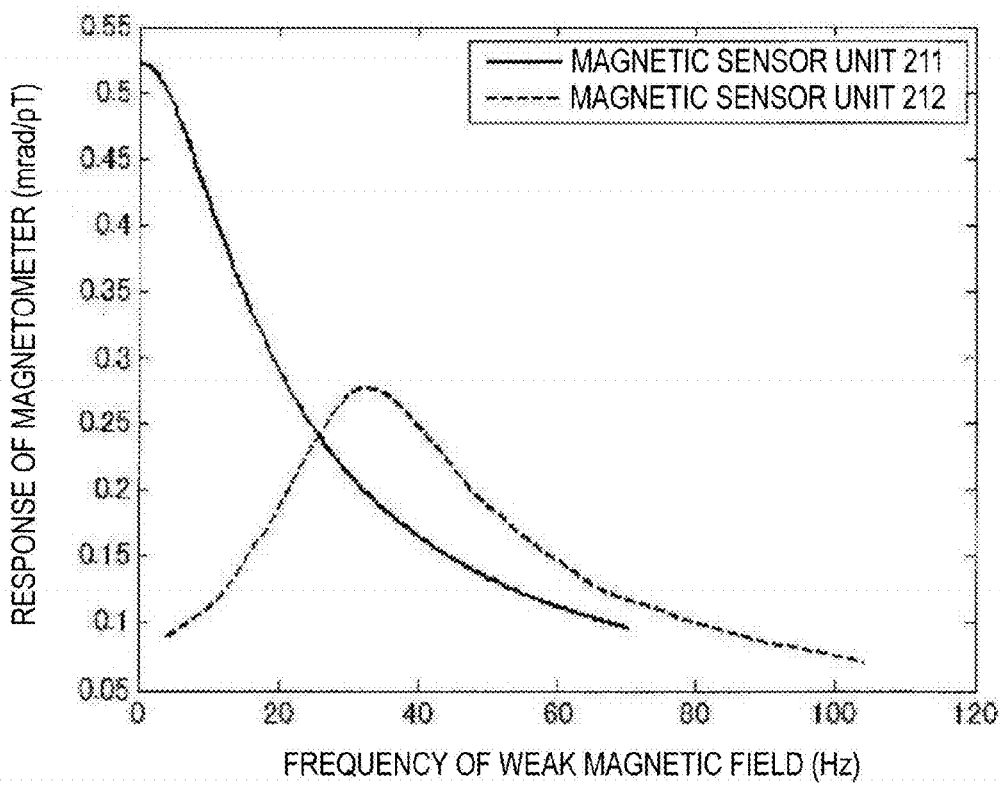
FIG. 10 is a graph showing the relation between the responses of magnetometers in magnetic sensor units and the frequency of a weak magnetic field according to example embodiment 2.

In addition, the driving current from the signal generator 202 connected to the sensor electric unit 222 is made 10.03 kHz. Namely, the Larmor frequency detuning with respect to the oscillating magnetic field is zero in the magnetic sensor unit 211, whereas the detuning is 30 Hz in the magnetic sensor unit 212. FIG. 10 shows the relation between the responses of the magnetometers in the magnetic sensor unit 211 and magnetic sensor unit 212 and the frequency of the weak magnetic field in this case.

It is to be noted that the transverse relaxation time is 11.9 ms. Only with the magnetic sensor unit 211, the response with respect to a frequency of 25 Hz or more is decreased down to not more than half the response at a lower frequency (10 Hz).

However, the weak magnetic field can be measured with the response not less than half the response at a lower frequency (10 Hz) up to the frequency of 40 Hz, by simultaneous measurements in such a way that the magnetic sensor unit 211 is used in a frequency band with a frequency component of less than 25 Hz in the weak magnetic field generated from the head 251 of the subject, whereas the magnetic sensor unit 212 is used in a frequency band with a frequency component of 25 Hz or more in the weak magnetic field.

The output from the magnetic sensor unit 211 and the sensor electric unit 221 and the output from the magnetic sensor unit 212 and the sensor electric unit 222 are subjected to a fast Fourier transform (FFT) frequency analysis in the personal computer 24.

Then, the output from the sensor electric unit 221 in the case of the frequency component of less than 25 Hz, or from the sensor electric unit 222 in the case of the frequency component of 25 Hz or more is output as the measurement results of the weak magnetic field generated from the head 251 of the subject.

While the two magnetic sensor units which differ in Larmor frequency detuning with respect to the oscillating magnetic field are used in the present example embodiment, embodiments are not limited thereto, but three or more magnetic sensor units may be used.

According to the present subject matter, an optical pumping magnetometer and a magnetic sensing method can be achieved which make it possible to improve the response of the magnetometer with respect to a magnetic field that varies with a period shorter than the transverse relaxation time of electron spin of an alkali metal atom and make highly sensitive measurements of magnetic signals when the magnetic field is measured with variation in Larmor frequency.

While the present subject matter has been described with reference to example embodiments, it is to be understood that the subject matter claimed herein is not limited to the disclosed example embodiments. The scope of the following claims is to be accorded the broadest interpretation so as to encompass all such modifications and equivalent structures and functions.

This application claims the benefit of Japanese Patent Application No. 2013-092130, filed Apr. 25, 2013, which is hereby incorporated by reference herein in its entirety.

What is claimed is:

1. An optical pumping magnetometer for measuring a magnetic field with variation in Larmor frequency, the optical pumping magnetometer comprising:
a unit configured to irradiate a cell with circularly polarized pumping light, to produce the cell containing an alkali metal atoms and spin polarization of the alkali metal atoms in the cell;
a unit configured to emit linearly polarized probe light for reading spin of the alkali metal atoms;
a probe light detection system configured to detect a rotational displacement of a plane of polarization of the linearly polarized probe light;
a static magnetic field application coil configured to apply a static magnetic field to the alkali metal atoms;
an oscillating magnetic field application coil configured to apply an oscillating magnetic field for causing a rotational motion around the spin of the alkali metal atoms; and
a unit configured to detect information including a phase difference between an output signal from the probe light detection system and a driving current input into the oscillating magnetic field application coil,
wherein detuning as a difference between Larmor frequency determined from the static magnetic field and a frequency of the driving current input into the oscillating magnetic field application coil is configured to be set within a predetermined range with respect to a measured magnetic field by adjusting the static magnetic field or the oscillating magnetic field, so as to improve response of the optical pumping magnetometer.

2. The optical pumping magnetometer according to claim 1, wherein the static magnetic field is adjusted by adjusting a value of a current input into the static magnetic field application coil.

3. The optical pumping magnetometer according to claim 1, wherein the oscillating magnetic field is adjusted by adjusting a frequency of a current input into the oscillating magnetic field application coil.

4. The optical pumping magnetometer according to claim 1, wherein the detuning is set within a range of ±20% with respect to the measured magnetic field.

5. The optical pumping magnetometer according to claim 1, wherein the period of the varying measured magnetic field is shorter than transverse relaxation time of electron spin of an alkali metal atom.

6. The optical pumping magnetometer according to claim 5, wherein the varying measured magnetic field is a weak magnetic field generated from a head of a subject.

7. An optical pumping magnetometer comprising more than one optical pumping magnetometer according to claim 1, wherein respective detuning in the optical pumping magnetometers with respect to the measured magnetic field differs from each other within a predetermined range.

8. A magnetic sensing method for measuring a magnetic field with variation in Larmor frequency, the method comprising:
    carrying out circularly polarized optical pumping for producing a cell containing an alkali metal atoms and spin polarization of the alkali metal atoms in the cell;
    reading spin of the alkali metal atoms;
    applying a static magnetic field to the alkali metal atoms;
    applying an oscillating magnetic field for causing a rotational motion of the spin of the alkali metal atoms around the static magnetic field;
    detecting information including a phase difference between an output signal obtained in the step of reading the spin of the alkali metal atoms and an input signal for generating the oscillating magnetic field in the step of applying oscillating magnetic field; and
    setting detuning as a difference between Larmor frequency determined from the static magnetic field and a frequency of a driving current input into a coil to which the oscillating magnetic field is applied, within a predetermined range with respect to a measured magnetic field by adjusting the static magnetic field or the oscillating magnetic field, so as to improve response of the optical pumping magnetometer.

9. The magnetic sensing method according to claim 8, wherein the static magnetic field is adjusted by adjusting a value of a current input into the static magnetic field application coil.

10. The magnetic sensing method according to claim 8, wherein the oscillating magnetic field is adjusted by adjusting a frequency of a current input into the oscillating magnetic field application coil.

11. The magnetic sensing method according to claim 8, wherein the detuning is set within a range of ±20% with respect to the measured magnetic field.

12. The magnetic sensing method according to claim 8, wherein the measured magnetic field is a magnetic field varying with a period shorter than transverse relaxation time of electron spin of an alkali metal atom.

13. The magnetic sensing method according to claim 12, wherein the magnetic field varying with the shorter period is a weak magnetic field generated from a head of a subject.

14. A non-transitory computer storage medium storing thereon a program configured to cause a computer to execute the magnetic sensing method according to claim 8.

* * * * *